United States Patent
Karanjkar et al.

(10) Patent No.: US 12,424,981 B2
(45) Date of Patent: Sep. 23, 2025

(54) METHODS AND APPARATUS TO REDUCE ERROR IN OPERATIONAL AMPLIFIERS

(71) Applicant: Texas Instruments Incorporated, Dallas, TX (US)

(72) Inventors: Kunal Karanjkar, Bangalore (IN); Venkata Ramanan R, Bangalore (IN); Srinivasa BS Chakravarthy, Bangalore (IN); Per Torstein Roine, Oslo (NO)

(73) Assignee: Texas Instruments Incorporated, Dallas, TX (US)

( * ) Notice: Subject to any disclaimer, the term of this patent is extended or adjusted under 35 U.S.C. 154(b) by 423 days.

(21) Appl. No.: 17/897,958

(22) Filed: Aug. 29, 2022

(65) Prior Publication Data
US 2023/0308055 A1    Sep. 28, 2023

(30) Foreign Application Priority Data
Mar. 28, 2022    (IN) .............................. 202241017794

(51) Int. Cl.
*H03F 1/26* (2006.01)
*H03F 1/30* (2006.01)

(52) U.S. Cl.
CPC .............. *H03F 1/26* (2013.01); *H03F 1/304* (2013.01); *H03F 2200/375* (2013.01)

(58) Field of Classification Search
CPC ...... H03F 1/26; H03F 1/304; H03F 2200/375; H03F 2200/129; H03F 2203/45528; H03F 3/187; H03F 3/393; H03F 3/45192; H03F 3/45775

USPC ........................................ 330/75, 9, 252–261
See application file for complete search history.

(56) References Cited

U.S. PATENT DOCUMENTS

| 7,795,960 B2* | 9/2010 | Lyden ................. H03F 3/45475 330/9 |
| 11,177,821 B1* | 11/2021 | Steensgaard-Madsen .................... H03M 1/0607 |
| 2011/0254621 A1* | 10/2011 | Rice .................... H03M 1/0818 330/9 |

OTHER PUBLICATIONS

Texas Instruments, "OPAx388 Precision, Zero-Drift, Zero-Crossover, True Rail-to-Rail, Input/Output Operational Amplifiers," Product Manual for Model Nos. OPA388, OPA2388, OPA4388, Nov. 2016—Revised Jul. 2020, 46 pages.

* cited by examiner

*Primary Examiner* — Hieu P Nguyen
(74) *Attorney, Agent, or Firm* — Xianghui Huang; Frank D. Cimino (57) ABSTRACT

An example device includes: switch circuitry configured to: connect, in a first state based on a control signal, a first switch input to a first switch output and a second switch input to a second switch output; and connect, in a second state based on the control signal, the first switch input to the second switch output and the second switch input to the first switch output; an operational amplifier configured to: generate, in response to the control signal, a first voltage based on a gain and the connections in the first state; and generate, in response to the control signal, a second voltage based on the gain and the connections in the second state; and an Analog to Digital Converter (ADC) configured to convert the first voltage and the second voltage into a digital value based on a multiplication of the input voltage and the gain.

20 Claims, 6 Drawing Sheets

METHODS AND APPARATUS TO REDUCE ERROR IN OPERATIONAL AMPLIFIERS

CROSS-REFERENCE TO RELATED APPLICATION

This patent application claims the benefit of and priority to Indian Provisional Patent Application No. 202241017794 filed Mar. 28, 2022, which Application is hereby incorporated herein by reference in its entirety.

TECHNICAL FIELD

This description relates generally to operational amplifiers (op amps), and more particularly to methods and apparatus to reduce error in operational amplifiers.

BACKGROUND

Operational amplifiers are used frequently in analog circuitry to produce an output voltage that is amplified relative to an input voltage. In some examples, the ratio of the output voltage of an operational amplifier to the input voltage of the operational amplifier is referred to as the gain of the operational amplifier. In some configurations, such as a negative feedback loop, the gain of an operational amplifier may be configured by external components.

SUMMARY

For methods and apparatus to reduce error in operational amplifiers, an example device includes: switch circuitry configured to: connect, in a first state based on a control signal, the first switch input to the first switch output and the second switch input to the second switch output; and connect, in a second state based on the control signal, the first switch input to the second switch output and the second switch input to the first switch output; the operational amplifier configured to: generate, in response to the control signal, a first voltage based on a gain and the connections in the first state; and generate, in response to the control signal, a second voltage based on the gain and the connections in the second state; and an Analog to Digital Converter (ADC) configured to convert the third voltage and fourth voltage into a digital value based on a multiplication of the input voltage and the gain.

BRIEF DESCRIPTION OF THE DRAWINGS

The same reference numbers or other reference designators are used in the drawings to designate the same or similar (functionally and/or structurally) features.

DETAILED DESCRIPTION

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Operational amplifiers are used in a wide variety of applications, including signal processing, sensing, control systems, etc. In many applications, an operational amplifier is used as an initial computation in a system that performs additional computations using the output of the operational amplifier. In such applications, the performance of the operational amplifier can have a significant impact on the performance of the system as a whole. As such, electronics manufacturers may seek to continually improve the performance and accuracy of operational amplifiers.

One manner of characterizing the performance of an operational amplifier is offset voltage. An offset voltage refers to an error in which the voltage produced by the operational amplifier is different from an expected voltage. For example, an operational amplifier having a gain of 10 may output 10.2 milli-Volts (mV) in response to a 1 mV signal, wherein the 0.2 mV is due to offset voltage. Offset voltage may occur due to a difference between the voltages received at an input stage of transistors within the operational amplifier. Furthermore, the magnitude of offset voltage is affected by the temperature of the operational amplifier. Temperature drift, a metric that quantifies how much an offset voltage changes in response to a temperature change, may also be used to characterize the performance of an operational amplifier.

In some examples, electronics manufacturers may mitigate offset voltage using a chopping technique. When using a chopping technique, the output of an operational amplifier can be characterized as a square wave that alternates between a maximum of G×(input voltage+offset voltage) and a minimum of G×(input voltage−offset voltage), where G refers to the gain of the operational amplifier. Prior solutions utilizing the chopping technique may mitigate the offset voltage by implementing a frequency filter to average the maximum and minimum voltages and thereby remove the offset voltage swing. However, prior solutions that utilize chopping may require additional space in an integrated circuit to implement the both the operational amplifier and the frequency filter, leading to increased manufacturing costs.

Example methods, systems, and apparatus described herein describe an example operational amplifier implemented on an integrated circuit (such as a microprocessor) including an example Analog to Digital Converter (ADC). Advantageously, the offset swing that occurs from using a chopping technique is removed when the example ADC samples the output of the operational amplifier. As a result, examples herein describe techniques to remove offset voltage without the use of circuitry external to a microprocessor such as a frequency filter. Additionally, the example operational amplifier alternates between G×(input voltage+offset voltage) and G×(input voltage−offset voltage) at a rate determined by the example ADC. As a result, the example operational amplifier may exhibit lower offset voltage and lower temperature drift than previous solutions.

Figure 1:
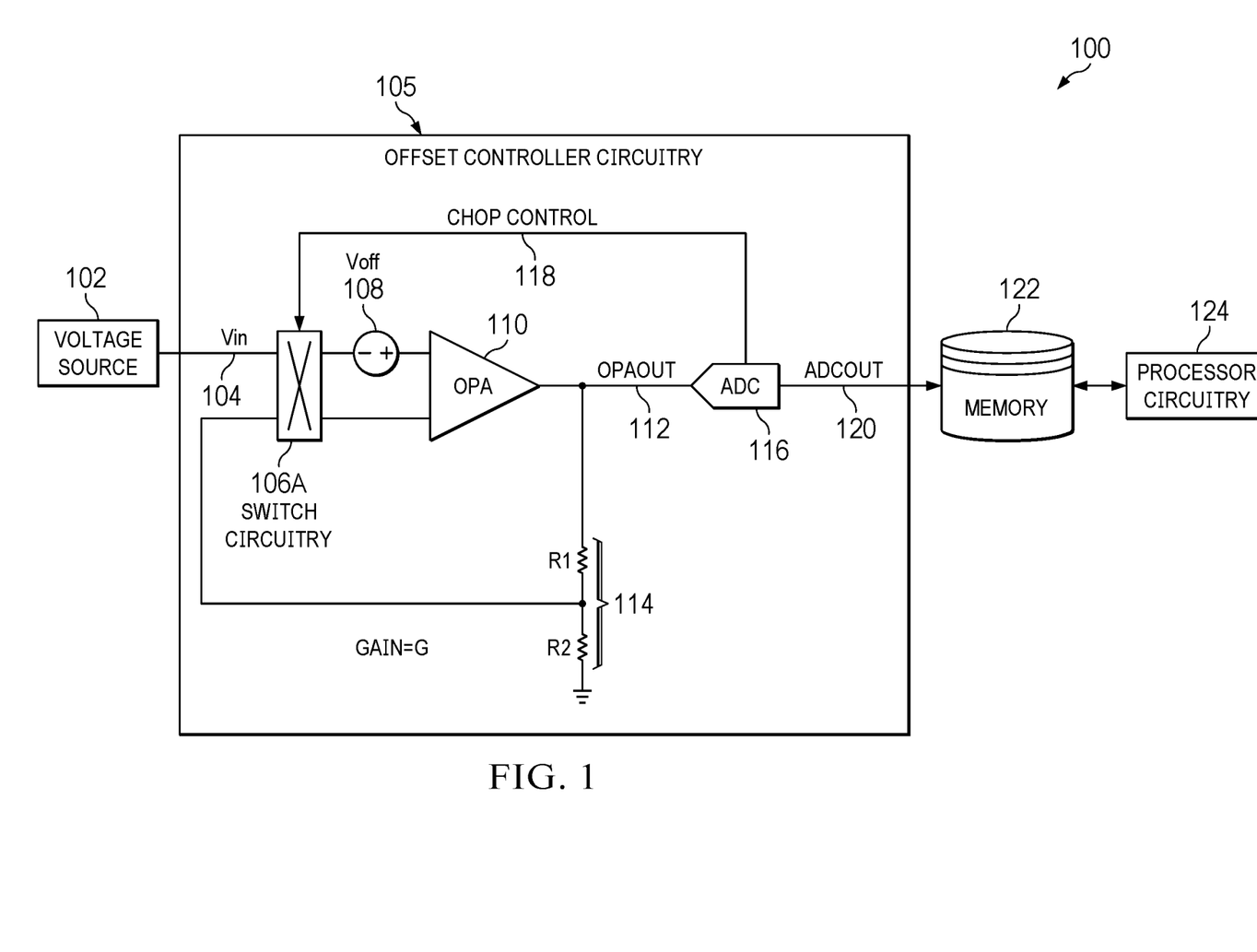
FIG. 1 is an example block diagram of a computer system.

FIG. 1 is an example block diagram of example computer system 100. The example computer system 100 includes an example voltage source 102, an example input voltage 104, example offset controller circuitry 105, example ADC output signal 120, example memory 122, and example processor circuitry 124. The example offset controller circuitry 105 includes example switch circuitry 106A, an example offset voltage 108, an example operational amplifier 110, an example op amp output signal (OPAOUT) 112, an example voltage divider 114, an example ADC 116, and an example chop control signal 118.

The example voltage source 102 generates the input voltage 104. The example voltage source 102 may be implemented as any type of device and may generate the input voltage 104 for any purpose. For example, the voltage source 102 may be sensor circuitry that generates the input voltage 104 to perform a measurement. In another example, the voltage source 102 may be transceiver circuitry that generates the input voltage 104 in response to receiving data over a transmission medium (e.g., a cell network, a cable, etc.). In some examples, the input voltage 104 may change over time.

The example offset controller circuitry 105 receives the input voltage 104 from the voltage source 102 and produces digital values (i.e., '0' and '1' bits) representative of the input voltage. The digital values may be referred to as the example ADC output signal 120. The components within the example offset controller circuitry 105 may be implemented together on an integrated circuit. In some examples, one or more of the example voltage source 102, example memory 122, and example processor circuitry 124 may be implemented on the same integrated circuit as the example offset controller circuitry 105. In other examples, one or more of the example voltage source 102, example memory 122, and example processor circuitry 124 may be implemented separately from the example offset controller circuitry 105.

Within the example offset controller circuitry 105, the example switch circuitry 106A includes a plurality of switches. The example switch circuitry 106A has two inputs and two outputs. The example switch circuitry 106A transitions between a first state and a second state based on the chop control signal 118. In the first state, a first input is connected to a first output and a second input is connected to a second output in each of the example switch circuitry 106A. In the second state, the first input is connected to the second output and the second input is connected to the first output in the example switch circuitry 106A. The example switch circuitry 106A is discussed further in connection with FIG. 2.

Within the example offset controller circuitry 105, the example offset voltage 108 is a representation of the internal error in the operational amplifier 110. In the illustrative example of FIG. 1, the example offset voltage 108 is represented externally from the operational amplifier 110 to both visually indicate the error, and to enable the operational amplifier 110 to be functionally described as an ideal op amp. An ideal op amp is a hypothetical model of an operational amplifier that has infinite input impedance, no output impedance, and does not produce an error. The example offset voltage 108 may be any value. In some examples, the example offset voltage 108 may change over time due to a change in the ambient temperature.

Within the example offset controller circuitry 105, the example operational amplifier 110 receives a differential input in the form of two input voltages from the switch circuitry 106A. The example operational amplifier 110 generates an output voltage, the op amp output signal 112, that is amplified relative to the input voltage between the differential pair of inputs. The gain of the operational amplifier 110 may be any value. In examples used herein, the gain of the operational amplifier 110 may be generalized as the variable G. The example operational amplifier 110 is represented as an ideal op amp in FIG. 1. A practical implementation of the example operational amplifier 110 is discussed further in connection with FIG. 3.

Within the example offset controller circuitry 105, the example voltage divider 114 is implemented by two or more resistors in series which are coupled to the op amp output signal 112 at a first node and coupled to ground at a second node. The example voltage divider 114 also includes one or more intermediate nodes in between the resistors connected in series. Each intermediate node exhibits an intermediate voltage that is less than the op amp output signal 112 but is greater than ground (e.g., 0 volts (V)). The voltage of any intermediate node in the voltage divider 114 can be described as $$OPAOUT_{112} \times \left(\frac{R_2}{R_1 + R_2}\right), \text{ where } OPAOUT_{112}$$

is the voltage from the op amp output signal 112, $R_1$ is the total resistance between the intermediate node and the first node, and $R_2$ is the total resistance between the intermediate node and ground. In FIG. 1, a manufacturer may pre-determine the values of the resistors within the example voltage divider 114 such that one of the intermediate nodes has a voltage of $$\frac{OPAOUT_{112}}{G}$$

This node is connected to the second input of the switch circuitry 106A. The values of the resistors used in the voltage divider 114 values may be pre-determined by a manufacturer and may be based on the gain G.

Within the example offset controller circuitry 105, the example ADC 116 converts the op amp output signal 112, an analog voltage, into digital bits. The example ADC 116 generates the ADC output signal 120, which includes a high supply voltage for a logical '1' bit and a low supply voltage for a logical '0' bit. The example ADC 116 also generates the chop control signal 118. The example chop control signal 118 is discussed further in connection with FIGS. 2 and 4.

The example memory 122 stores the digital bits encoded in the ADC output signal 120. The example memory 122 may be implemented as any type of memory. For example, the example memory 122 may be a volatile memory or a non-volatile memory. The volatile memory may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory may be implemented by flash memory and/or any other desired type of memory device.

The example processor circuitry 124 may obtain the digital bits from memory 122. and perform operations based on the digital bits. For example, the digital bits may represent sensor readings, and the processor circuitry 124 may perform operations by presenting the readings to a user on a display. In another example, the digital bits represent a message from an external device, and the processor circuitry 124 may perform operations by sending a reply message to the external device. The example processor circuitry 124 may be implemented by any type of processor device. Examples of processor devices include programmable microprocessors, Field Programmable Gate Arrays (FPGAs) that may instantiate instructions, Central Processor Units (CPUs), Graphics Processor Units (GPUs), Digital Signal Processors (DSPs), or microcontrollers and integrated circuits such as Application Specific Integrated Circuits (ASICs).

Advantageously, the components of the example offset controller circuitry 105 may be implemented together on a single integrated circuit such as a microprocessor. Because ADCs are common components used in a variety of applications, a manufacturer may design a microprocessor to include an ADC by default. As such, the use of the example ADC 116 to correct the offset voltage produced in the op amp output signal 112 does not require additional die space on the integrated circuit like the frequency filter of previous solutions.

The example switch circuitry 106A changes between the first state and second state based on the chop control signal 118. In doing so, the example computer system 100 implements a chopping technique in which the op amp output signal 112 alternates between $G \times (V_{IN_{104}} + V_{OFF_{108}})$ and $G \times (V_{IN_{104}} - V_{OFF_{108}})$. As used above and herein, $V_{IN_{104}}$ refers to the example input voltage 104 and $V_{OFF_{108}}$ refers to the example offset voltage 108. Advantageously, the use of the example ADC 116 to both correct the offset voltage and to determine when the op amp output signal 112 changes values via the chop control signal 118 results in smaller magnitudes of offset voltage and temperature drift than previous solutions.

Figure 2:
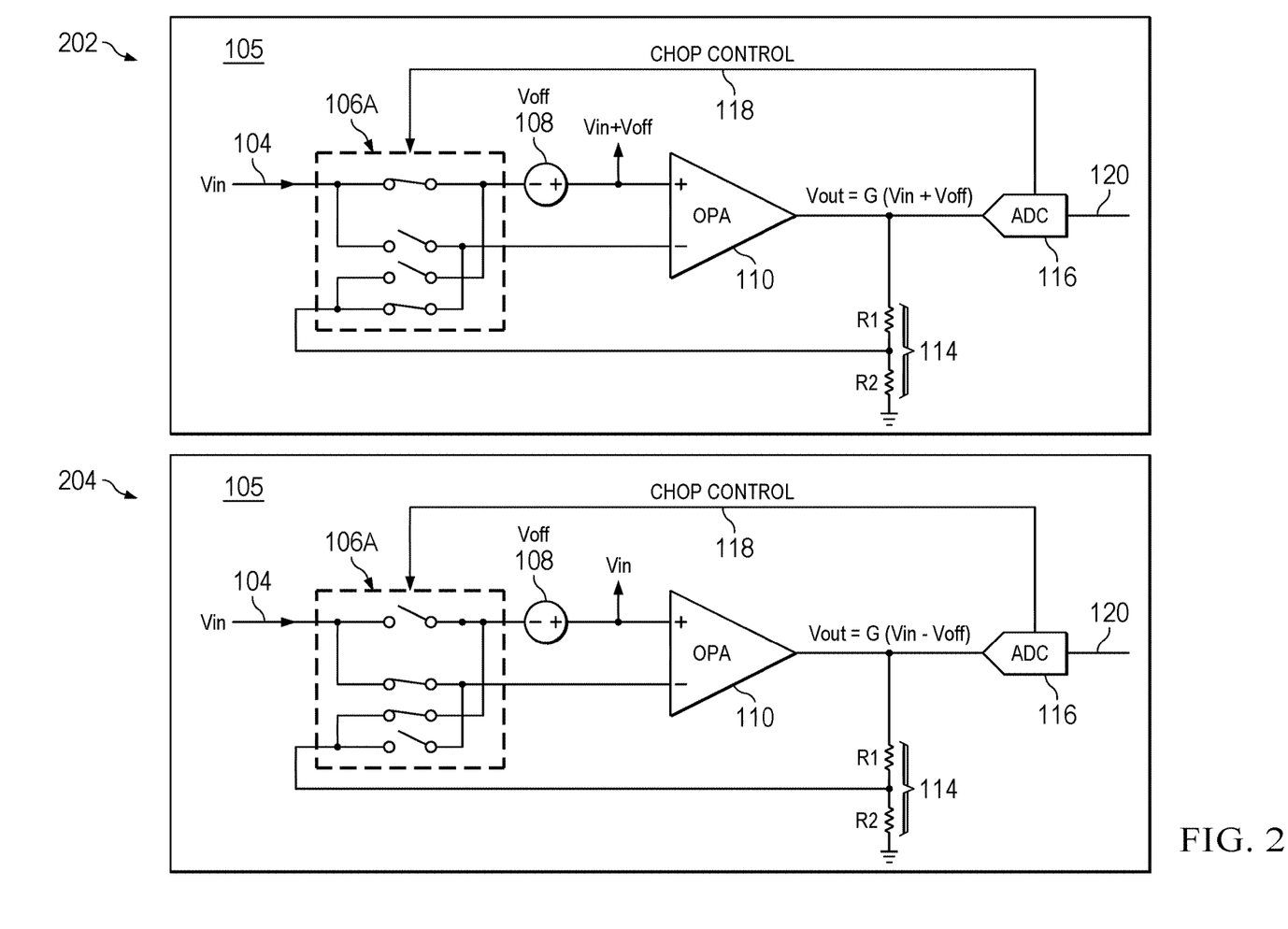
FIG. 2 shows example block diagrams of the example offset controller circuitry of FIG. 1.

FIG. 2 shows example block diagrams of the example offset controller circuitry 105 of FIG. 1. FIG. 2 includes example configurations 202, 204. The example configurations 202, 204 show the example switch circuitry 106A in two different states. In FIG. 2, the offset voltage 108 is illustrated external to the example operational amplifier 110 and the example operational amplifier 110 is represented as an ideal op amp.

The switch circuitry 106A includes two inputs. In the example switch circuitry 106A, a first input is connected to the input voltage 104 and the second input is connected to an intermediate node of the voltage divider 114. The switch circuitry 106A additionally includes two outputs. In the example configurations 202, 204, the switch circuitry 106A may be implemented by four single pole single throw (SPST) switches, which in turn may be implemented using transistors or other suitable switching circuit elements. In such examples, within the switch circuitry 106A, a first SPST switch connects the first input to a first output, a second SPST switch connects the first input to a second output, a third SPST switch connects the second input to the first output, and the fourth SPST switch connects the second input to the second output. In other examples, different numbers of different switches may be used to implement the switch circuitry 106A. For example, two single pole double throw (SPDT) switches may be implemented where a given SPDT switch connects one of the inputs to both of the first and second outputs.

The example configuration 202 shows the example switch circuitry 106A in the first state. In the first state, the switch circuitry 106A connects the input voltage 104 to the first output and the op amp output signal 112 to the second output. The first output of the switch circuitry 106A is then connected in series to the external representation of the offset voltage 108. Therefore, the voltage experienced by the positive input terminal of the example operational amplifier 110 in the example configuration 202 is $(V_{IN_{104}} + V_{OFF_{108}})$. Furthermore, a property of ideal op amps is that the output voltage increases, thus increasing the feedback input, until the voltage difference between the input terminals is 0 V. As such, the voltage experienced by the negative input terminal of the example operational amplifier 110 in the example configuration 202 at steady state is also $(V_{IN_{104}} + V_{OFF_{108}})$. These voltages are then amplified by G within the example operational amplifier 110. Therefore, the op amp output signal 112 is $G \times (V_{IN_{104}} + V_{OFF_{108}})$ when the switch circuitry 106A is in the first state.

The example configuration 204 shows the example switch circuitry 106A in the second state. In the second state, the switch circuitry 106A connects the input voltage 104 directly to the negative terminal of the operational amplifier 110 via the second output. Furthermore, because the example operational amplifier 110 is represented as an ideal op amp, both terminals of the example operational amplifier 110 should experience the input voltage 104. However, the positive input terminal of the operational amplifier 110 is still connected in series with the offset voltage 108. As such, the voltage experienced by the positive input terminal is the sum of the offset voltage 108 and the voltage at the first output of the switch circuitry 106A. Therefore, in order for the positive terminal of the operational amplifier 110 to experience the input voltage 104, the voltage at the first output of the switch circuitry 106A must be $V_{IN_{104}} - V_{OFF_{108}}$. In the example configuration 204, the first output of the switch circuitry 106A is connected in series to the second input of the switch circuitry 106A, which in turn is connected in series to the output of the example voltage divider 114. The example voltage divider 114 is designed to output a voltage that has a smaller amplitude than the example op amp output signal 112. Specifically, the output of the example voltage divider 114 has an amplitude that is reduced by a factor of G relative to the example op amp output signal 112. Therefore, for the voltage at the first output of the switch circuitry 106A to be $V_{IN_{104}} - V_{OFF_{108}}$, the example op amp output signal 112 is $G \times (V_{IN_{104}} - V_{OFF_{108}})$ when the switch circuitry 106A is in the second state.

FIG. 2 illustrates how the example switch circuitry 106A is used to alternate the value of the op amp output signal 112 within the example offset controller circuitry 105. For example, when the chop control signal 118 indicates the switch circuitry 106A should be in the first state, the example offset controller circuitry 105 operates in the example configuration 202 such that op amp output signal$_{112} = G \times (V_{IN_{104}} + V_{OFF_{108}})$. Additionally, when the chop control signal 118 indicates the switch circuitry 106A should be in the second state, the example offset controller circuitry 105 operates in the example configuration 204 such that op amp output signal$_{112} = G \times (V_{IN_{104}} - V_{OFF_{108}})$. Advantageously, the example chop control signal 118 is generated by the example ADC 116. As a result, the frequency at which the chop control signal 118 transitions between the two values of the op amp output signal 112 is synchronous with the rate at which the example ADC 116 samples the op amp output signal 112 to convert the analog voltage into a digital value. The synchronous implementation of the example chop control signal 118 via the example ADC 116 may reduce the magnitude of the offset voltage and temperature drift of the example operational amplifier 110 when compared to previous solutions.

Figure 3:
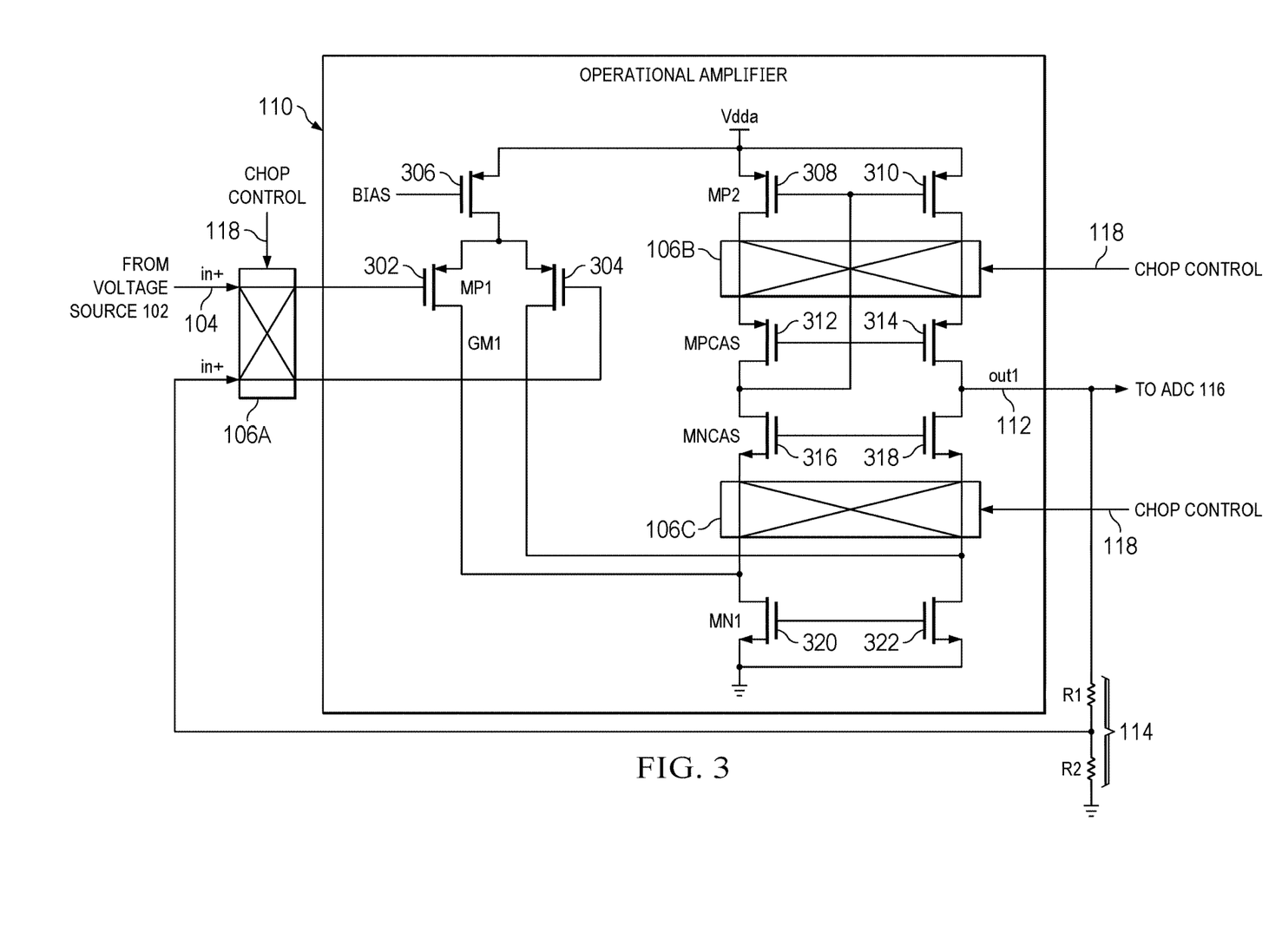
FIG. 3 is an example circuit diagram of the switch circuitry and operational amplifier of FIG. 1.

FIG. 3 is a circuit diagram of the switch circuitry 106A and the example operational amplifier 110 of FIG. 1. FIG. 3 includes the switch circuitry 106A, the example operational amplifier 110, and the example voltage divider 114. The example operational amplifier 110 includes example Positive Metal Oxide Semiconductor (PMOS) transistors 302, 304, 306, 308, 310, 312, 314, example Negative Metal Oxide Semiconductor (NMOS) transistors 316, 318, 320, 322, and example switch circuitry 106B, 106C.

The example PMOS transistors 302, 304, 306 are configured to form an input stage of the operational amplifier. In the input stage, the current that flows through the drain gate of the PMOS transistors 302, 304 is proportional to the voltage provided by the input voltage 104 and voltage divider 114. While the two voltages provided by the switch circuitry 106A are ideally equal in magnitude, in practice, may be different. The difference in magnitude of voltages measured at 302 and 304 is the offset voltage 108.

The example PMOS transistors 308, 310, 312, 314, and example NMOS transistors 316, 318, 320, 322 collectively form a folded cascode amplifier. The gain of the operational amplifier 110, which is a measurement of the amplification of the voltage between NMOS transistors 318, 322, is based on the transconductance of the transistors within the folded cascode amplifier.

In practice, the example operational amplifier 110 may include three example switch circuitry 106A, 106B, 106C implementations as described in FIG. 3. The example switch circuitry 106B, 106C may be implemented in a similar fashion to the example switch circuitry 106A described previously. That is, the example switch circuitry 106B, 106C each have two inputs and two outputs. The example switch circuitry 106B, 106C each transition between the first state and a second state based on the chop control signal 118. Furthermore, the example switch circuitry 106A, 106B, 106C may be configured such that, at any point in time, the three switch circuitry 106A, 106B, 106C are either all in the first state or all in the second state. The example switch circuitry 106B, 106C may each be implemented by four SPST switches, which in turn may be implemented using transistors or other suitable switching circuit elements. While the example switch circuitry 106B, 106C were not required in FIGS. 1, 2 to describe the example operational amplifier 110 as an ideal op amp, in practice, the example operational amplifier 110 may include each of the example switch circuitry 106A, 106B, 106C in order to output $G \times (V_{IN_{104}} + V_{OFF_{108}})$ in the first state and $G \times (V_{IN_{104}} - V_{OFF_{108}})$ in the second state based on the example chop control signal 118.

The example switch circuitry 106B has two inputs and two outputs. The two inputs of the example switch circuitry 106B are coupled to the drain gates of the example PMOS transistors 308, 310. The two outputs of the example switch circuitry 106B are coupled to the source gates of the example PMOS transistors 312, 314. When the example switch circuitry 106B is in the first state, the drain gate of the example PMOS transistor 308 is coupled to the source gate of the example PMOS transistor 312, and the drain gate of the example PMOS transistor 310 is coupled to the source gate of the example PMOS transistor 314. When the example switch circuitry 106B is in the second state, the drain gate of the example PMOS transistor 308 is coupled to the source gate of the example PMOS transistor 314, and the drain gate of the example PMOS transistor 310 is coupled to the source gate of the example PMOS transistor 312.

The example switch circuitry 106C has two inputs and two outputs. The two inputs of the example switch circuitry 106C are coupled to the source gates of the example NMOS transistors 316, 318. The two outputs of the example switch circuitry 106C are coupled to the drain gates of the example NMOS transistors 320, 322. When the example switch circuitry 106C is in the first state, the source gate of the example NMOS transistor 316 is coupled to the drain gate of the example NMOS transistor 320, and the source gate of the example NMOS transistor 318 is coupled to the source gate of the example NMOS transistor 322. When the example switch circuitry 106C is in the second state, the source gate of the example NMOS transistor 316 is coupled to the drain gate of the example NMOS transistor 322, and the source gate of the example NMOS transistor 318 is coupled to the source gate of the example NMOS transistor 320.

FIG. 3 illustrates how the operational amplifier 110 may be designed at a transistor level to amplify the input voltage 104 and implement the chopping technique. Advantageously, the operational amplifier 110 includes the switch circuitry 106B and 106C that are controlled by the example ADC 116 via the chop control signal 118. As a result, the example ADC 116 can produce digital bits that are not representative of the offset voltage 108, removing the need for additional die space to remove the offset voltage with circuitry such as a frequency filter. Furthermore, the use of the example ADC 116 to remove the offset voltage 108 reduces the magnitude of the offset voltage because the chop control signal 118 enables the output of the operational amplifier to be sampled and averaged, thereby removing offset. Furthermore, because the example ADC 116 may perform the chopping technique at multiple temperatures, the temperature drift of the example operational amplifier 110 may be lower than previous solutions.

Figure 4:
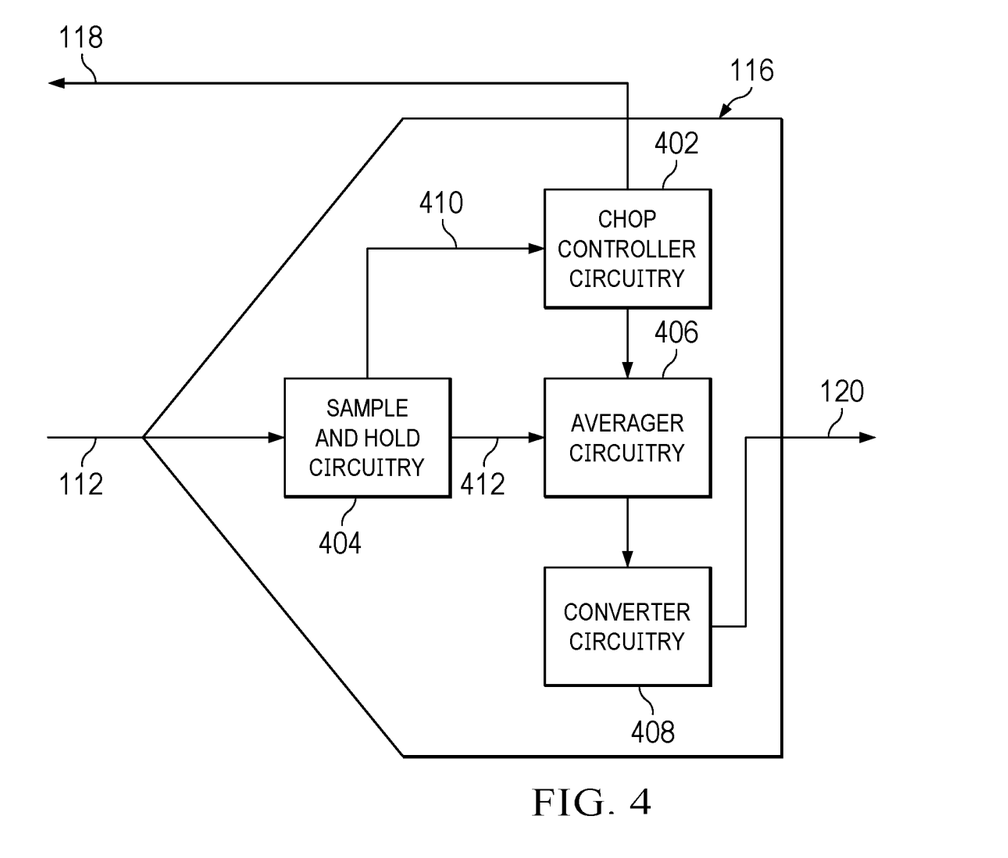
FIG. 4 is an example block diagram of the Analog to Digital Converter (ADC) circuitry of FIG. 1.

FIG. 4 is an example block diagram of the Analog to Digital Converter (ADC) circuitry of FIG. 1. The example ADC 116 includes example chop controller circuitry 402, example sample and hold circuitry 404, example averager circuitry 406, and example converter circuitry 408. FIG. 4 also includes the example op amp output signal 112, the example chop control signal 118, the example ADC output signal 120, an example ADC SOC signal 410, and an example sample output signal 412.

The example chop controller circuitry 402 implements the chopping technique according to the teachings of this disclosure. For example, the example chop controller circuitry 402 receives the example ADC SOC signal 410 from the example sample and hold circuitry 404 and generates the example chop control signal 118 synchronously. The example chop controller circuitry 402 also sends the chop control signal 118 to the example switch circuitry 106A, 106B, 106C to indicate when the switches should be in the first state and when the switches should be in the second state, as described previously in FIG. 2. The example chop control signal 118, and example ADC SOC signal 410 are discussed further in connection to FIG. 5. The example chop controller circuitry 402 additionally provides instructions to the example averager circuitry 406 to indicate when an average voltage should be computed.

The example sample and hold circuitry 404 receives the op amp output signal 112 generated by the example operational amplifier 110. Using a clock circuit, the example sample and hold circuitry 404 records a voltage from the op amp output signal 112 and outputs the recorded voltage for an amount of time. In some examples, the recorded voltage may be referred to as a sample or a conversion. The example sample and hold circuitry 404 sends the ADC SOC signal 410 to indicate when a new conversion has begun. Similarly, the amount of time that the example sample and hold circuitry 404 outputs a given recorded voltage may be referred to as a hold time. The example sample and hold circuitry 404 provides the sample output signal 412, which is the recorded voltage, to the example averager circuitry 406. The example op amp output signal 112 is discussed further in connection to FIG. 5.

The example averager circuitry 406 receives multiple voltages within the example sample output signal 412 over time. For example, the example averager circuitry 406 may receive a first recorded voltage for a first hold time, followed by a second recorded voltage for a second hold time, etc. Upon receiving instructions from the example chop controller circuitry 402, the example averager circuitry 406 computes an average of the previous two recorded voltages within the example sample output signal 412. The example averager circuitry 406 provides the computed average voltage to the converter circuitry 408.

The example converter circuitry 408 converts the computed average voltage into a digital value. The digital value may include any number of bits. The example converter circuitry 408 may produce the digital value using any Analog to Digital conversion technique. For example, the example converter circuitry 408 may implement a look up table that describes, for any computed average voltage within a range of values, what corresponding digital bits should be produced. In such examples, the look up table may be preprogrammed into the converter circuitry 408 or may be provided to the example converter circuitry 408 by the processor circuitry 124. The digital values produced by the example converter circuitry 408 are referred to as the example ADC output signal 120.

Advantageously, the example ADC 116 includes the example chop controller circuitry 402 to synchronize the chop control signal 118, the ADC SOC signal 410, and when the averager circuitry 406 computes an average. The example chop controller circuitry 402 enables the ADC 116 to remove offset by ensuring that one of the voltages used as an input to the averager circuitry 406 is equal to $G \times (V_{IN_{104}} + V_{OFF_{108}})$ and that the other voltage used an input to the averager circuitry 406 is equal to $G \times (V_{IN_{104}} - V_{OFF_{108}})$. As a result, the digital bits produced by the converter circuitry 408 are based on a computed average voltage of $G \times V_{IN_{104}}$. Furthermore, the use of the example ADC circuitry 116 to remove offset reduces implementation area compared to previous solutions that require an external filter to achieve the same.

Figure 5:
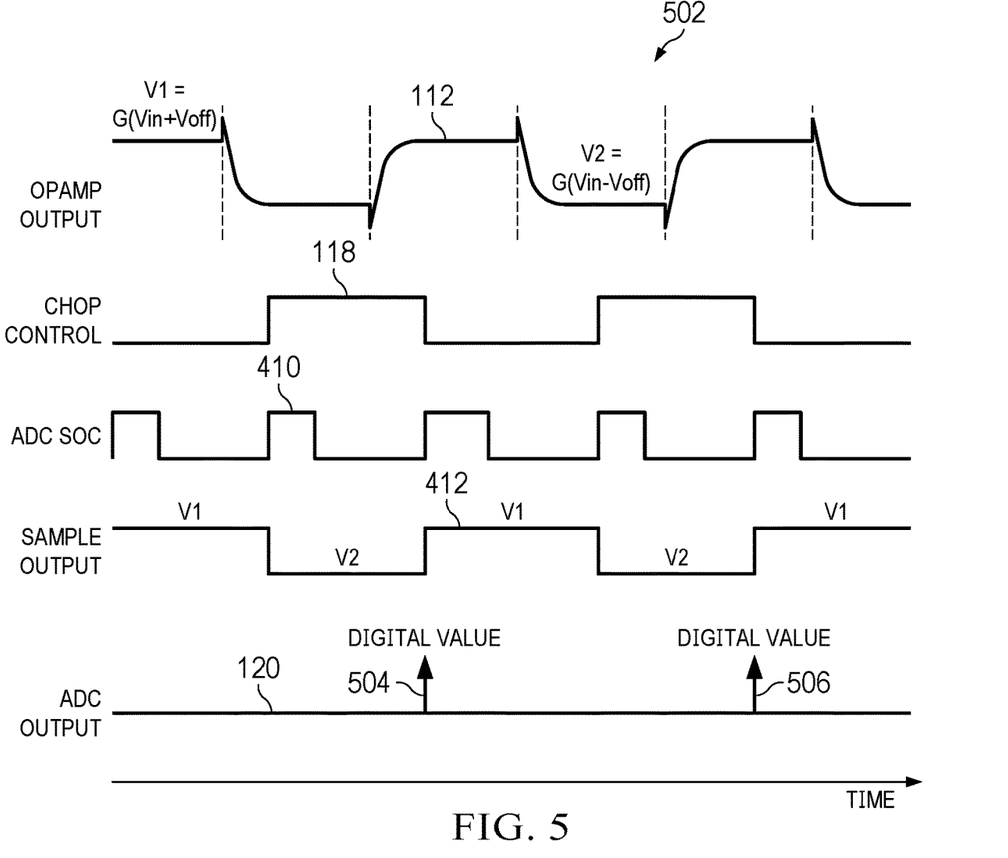
FIG. 5 shows a timing diagram illustrating the operational output signal, chop control signal, and the ADC output signal of FIG. 1, as well as the ADC start of conversion (SOC) signal and the sample output signal of FIG. 4.

FIG. 5 shows a timing diagram 502 illustrating the example op amp output signal 112, example chop control signal 118, example ADC SOC signal 410, example sample output signal 412, and the example ADC output signal 120.

The example timing diagram 502 shows how the op amp output signal 112 changes over time. Ideally, the op amp output signal 112 can be represented as a square wave that oscillates around $G \times V_{IN_{104}}$. When the example switch circuitry 106A, 106B 106C are in the first state, the example op amp output signal 112 is at a voltage, described in FIG. 5 as $V_1$, that is $G \times V_{OFF_{108}}$ volts greater than $G \times V_{IN_{10}}$. Similarly, when the example switch circuitry 106A, 106B 106C are in the second state, the example op amp output signal 112 is at a voltage, described in FIG. 5 as $V_2$, that is $G \times V_{OFF_{108}}$ volts less than $G \times V_{IN_{104}}$.

An ideal square wave includes instantaneous transitions between voltages. In practice, the example operational amplifier 110 may require an amount of time to transition between $V_1$ and $V_2$, as shown in FIG. 5. In some examples, the example operational amplifier 110 may additionally or alternatively overshoot or undershoot a target voltage (either $V_1$ or $V_2$) and require an amount of time to return to the target voltage. In some examples, the amount of time required for the example operational amplifier 110 to return to a target voltage after a transition occurs is referred to as a settle time.

The example timing diagram 502 shows the foregoing signal over 2.5 periods of the chopping frequency. During one period of the chopping frequency, the op amp output signal 112 transitions once between $G \times (V_{IN_{104}} + V_{OFF_{108}})$ and $G \times (V_{IN_{104}} - V_{OFF_{108}})$. Furthermore, during one period of the chopping frequency, the example ADC 116 produces one digital value.

The example chop control signal 118 includes a high supply voltage and a low supply voltage. When the example chop control signal 118 exhibits a low supply voltage, the example switch circuitry 106A, 106B, 106C are in the first state as described previously. Similarly, when the example chop control signal exhibits a high supply voltage, the example switch circuitry 106A, 106B, 106C are in the second state as described previously.

The example ADC SOC signal 410 describes when the example sample and hold circuitry 404 samples the op amp output signal 112. The example the example sample and hold circuitry 404 begins a sample of the example op amp output signal 112 when the ADC SOC signal 410 transitions from a low supply voltage to a high supply voltage. Similarly, the example the example sample and hold circuitry 404 ends the sample when the ADC SOC signal 410 transitions from the high supply voltage to the low supply voltage. The example ADC SOC signal 410 is produced by the example chop controller circuitry 402.

The example sample output signal 412 represents the voltages that the ADC records during each sample. While the example input voltage 104 may change over time, the example chop control signal 118 synchronizes the example chop control signal 118 and the example ADC SOC signal 410 such that the voltage recorded during any ADC sample period can be represented by one of two values. Specifically, samples labelled $V_1$ refer to the voltage $G \times (V_{IN_{104}} + V_{OFF_{108}})$ and samples labelled $V_2$ refer to the voltage $G \times (V_{IN_{104}} - V_{OFF_{108}})$. During one period of the chopping frequency, the example sample output signal 412 includes one sample labelled $V_1$ and one sample labelled $V_2$. To filter the offset voltage, the example converter circuitry 408 produces digital bits based off an average of the voltages recorded during one period of the chopping frequency (i.e., the voltages from two consecutive samples). Specifically, $$V_{Convert} = \frac{G \times (V_{IN_{104}} + V_{OFF_{108}}) + G \times (V_{IN_{104}} - V_{OFF_{108}})}{2} = G \times V_{IN_{104}},$$

where $V_{convert}$ is the analog voltage produced by the averager circuitry 406 and provided to the converter circuitry 408.

The example ADC output signal outputs 120 includes one new digital value for each period of a chopping frequency. In the example timing diagram of FIG. 5, the example ADC output signal 120 includes the example digital value 504 which the converter circuitry 408 generated based on a first value of $V_{convert}$. After two additional samples of the example op amp output signal 112, the example converter circuitry 408 generates the example digital value 506 based on a second value of $V_{convert}$. The example digital values 504, 506 may contain any amount of data. For example, the example digital values 504, 506 may contain one or more bits, bytes, words, etc., of data.

Advantageously, the chop control signal 118 (which dictates the value of the op amp output signal 112) is based on the ADC SOC signal 410 sent from the sample and hold circuitry 404 to the example chop controller circuitry 402.

Therefore, the example ADC 116 generates the chop control signal 118 and ADC SOC signal 410 synchronously in the sense that, after a transition in the chop control signal 118 occurs, the subsequent sample of the op amp output signal 112 does not begin until the op amp output signal 112 has had sufficient time to settle. Specifically, the op amp output signal 112 may be considered settled when the difference between the instantaneous voltage of the op amp output signal 112 and the desired target voltage (either $V_1$ or $V_2$) is less than or equal to an error threshold. In doing so, code 1 and code 2 of the example sample output signal 412 are based on the desired target voltage of the op amp output signal 112 rather than an overshoot voltage or undershoot voltage that the example operational amplifier 110 produces during the settle time.

Figure 6:
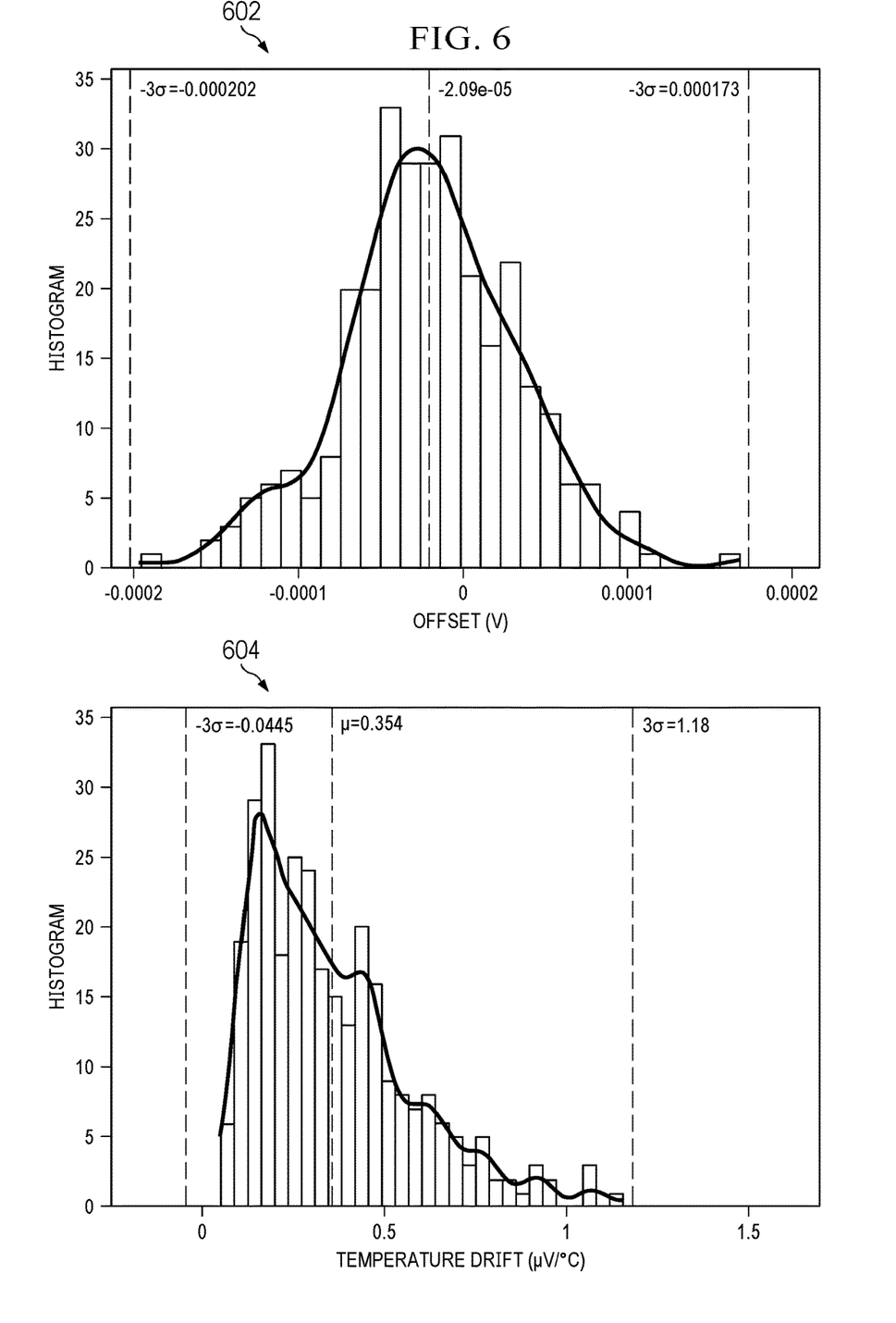
FIG. 6 are histograms describing the error of the offset controller circuitry of FIG. 1.

FIG. 6 includes histograms describing the error of the operational amplifier of FIG. 1. FIG. 6 includes example histograms 602, 604.

The example histogram 602 shows the offset of the example operational amplifier 110 over multiple simulations of the example computer system 100 operating. In some examples, the offset of the example operational amplifier 110 may be computed as a difference between a measured voltage of the op amp output signal 112 and an expected output voltage of the operational amplifier 110. In other examples, the offset of the example operational amplifier 110 may be computed as a difference between a measured voltage of the ADC output signal 120 and an expected output voltage of the ADC 116.

The x axis of the example histogram 602 shows the offset in volts, and y axis of the example histogram 602 shows the number of simulations in which the offset was computed between two particular voltages (i.e., the number of simulations that belong to a particular bin of the histogram). The example histogram 602 shows that across all example simulations, the example operational amplifier 110 exhibited an offset with a magnitude less than or equal to 202 micro Volts (µV).

The example histogram 602 shows the temperature drift of the example operational amplifier 110 over multiple simulations of the example computer system 100 operating. To compute a single temperature drift value, the example computer system 100 is simulated multiple times to operate at multiple ambient temperatures, and the offset is computed for each unique temperature simulation. The temperature drift can then be described as $$T_{drift} = \frac{\text{Offset}_{max} - \text{Offset}_{min}}{T_{max} - T_{min}},$$

where $T_{drift}$ is the temperature drift, $\text{Offset}_{max}$ is the highest recorded offset voltage, $\text{Offset}_{min}$ is the lowest recorded offset voltage, $T_{max}$ is the highest operating temperature, and $T_{min}$ is the lowest operating temperature.

The x axis of the example histogram 604 shows the temperature drift in micro Volts per degree Celsius (µV/° C.), and y axis of the example histogram 604 shows the number of simulations in which the temperature drift was computed between two particular values (i.e., the number of simulations that belong to a particular bin of the histogram). The example histogram 604 shows that across all example simulations, the example operational amplifier 110 exhibited a temperature drift with a magnitude less than or equal to 1.18 µV/° C.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

Example methods, apparatus and articles of manufacture described herein improve the performance of an operational amplifier and reduce the amount of die space needed to remove error from the operational amplifier. The output of the example operational amplifier 110 is provided directly to the example ADC 116 to remove the offset. Both the example operational amplifier 110 and example ADC 116 are implemented on the same integrated circuit, removing the need to use additional die space on a separate circuit to remove the offset. Furthermore, the example ADC 116 controls both when the output of the operational amplifier changes and when the output of the operational amplifier is sampled to form a digital value. As a result, the offset and temperature drift of the example operational amplifier 110 may be lower in magnitude than previous solutions.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value.

Modifications are possible in the described embodiments, and other embodiments are possible, within the scope of the claims.

What is claimed is:

1. A device comprising:
    an operational amplifier having:
        a positive input;
        a negative input; and
        an output;
    switch circuitry having:
        a first switch input configured to receive an input voltage;
        a first switch output coupled to the positive input of the operational amplifier;
        a second switch input coupled to the output of the operational amplifier; and
        a second switch output coupled to the negative input of the operational amplifier;
    wherein the switch circuitry is configured to:
        electrically couple, in a first state specified by a control signal, the first switch input to the first switch output and the second switch input to the second switch output; and
        electrically couple, in a second state specified by the control signal, the first switch input to the second switch output and the second switch input to the first switch output; and
    wherein the operational amplifier is configured to:
        generate a first voltage the switch circuitry in the first state; and
        generate a second voltage using the switch circuitry in the second state; and
    an Analog to Digital Converter (ADC) having:
        sample-and-hold circuitry coupled to the output of the operational amplifier; and
        control circuitry coupled to the sample-and-hold circuitry and configured to provide the control signal specifying either the first state or the second state based on the sample-and-hold circuitry;
    wherein the ADC is configured to convert the first voltage and second voltage into a digital value.

2. The device of claim 1, wherein the switch circuitry, the operational amplifier, and the ADC are implemented together on an integrated circuit.

3. The device of claim 1, wherein:
    the switch circuitry is a first switch circuitry;
    the operational amplifier further has a second switch circuitry;
        the second switch circuitry is configured to make a first set of electrical connections in the first state based on the control signal; and
        the second switch circuitry is configured to make a second set of electrical connections in the second state based on the control signal.

4. The device of claim 1, wherein the control circuitry is configured to cause the control signal to alternate between specifying the first state and specifying the second state at a rate based on a sampling rate of the sample-and-hold circuitry of the ADC.

5. The device of claim 1, wherein the ADC has averaging circuitry coupled to the sample-and-hold circuitry and configured to average the first voltage and the second voltage.

6. The device of claim 5, wherein the ADC has conversion circuitry coupled to the averaging circuitry and configured to provide the digital value based on an average of the first voltage and the second voltage.

7. The device of claim 1 further comprising:
    a first resistor coupled between the output of the operational amplifier and the second switch input of the switch circuitry; and
    a second resistor coupled between the first resistor and a ground.

8. The device of claim 3, wherein the operational amplifier has:
    a first transistor having:
        a source coupled to a voltage supply;
        a drain coupled to the second switch circuitry; and
        a gate;
    a second transistor having:
        a source coupled to the voltage supply;
        a drain coupled to the second switch circuitry; and
        a gate coupled to the gate of the first transistor;
    a third transistor having:
        a source coupled to the second switch circuitry;
        a drain coupled to the gate of the first transistor and the gate of the second transistor; and
        a gate; and
    a fourth transistor having:
        a source coupled to the second switch circuitry;
        a drain coupled to the output of the operational amplifier; and
        a gate coupled to the gate of the third transistor.

9. The device of claim 8, wherein the operational amplifier has:
    third switch circuitry;
    a fifth transistor having:
        a source coupled to the third switch circuitry;
        a drain coupled to the drain of the third transistor; and
        a gate;
    a sixth transistor having:
        a source coupled to the third switch circuitry;
        a drain coupled to the drain of the fourth transistor; and
        a gate coupled to the gate of the fifth transistor;
    a seventh transistor having:
        a source coupled to a ground;
        a drain coupled to the third switch circuitry; and
        a gate; and an eighth transistor having:
a source coupled to the ground;
a drain coupled to the third switch circuitry; and
a gate coupled to the gate of the seventh transistor.

10. A device comprising:
an operational amplifier having:
a positive input;
a negative input; and
an output;
switch circuitry having:
a first switch input coupled to receive an input voltage;
a first switch output coupled to the positive input of the operational amplifier;
a second switch input coupled to the output of the operational amplifier; and
a second switch output coupled to the negative input of the operational amplifier;
wherein the switch circuitry is configured to:
electrically connect, in a first state based on a control signal, the first switch input to the first switch output and the second switch input to the second switch output; and
electrically connect, in a second state based on the control signal, the first switch input to the second switch output and the second switch input to the first switch output;
wherein the operational amplifier is configured to:
generate, in response to the control signal, a first voltage; and
generate, in response to the control signal, a second voltage; and
an Analog to Digital Converter (ADC) having:
an input coupled to the operational amplifier;
a first output coupled to a memory; and
a second output coupled to the switch circuitry and configured to provide the control signal;
wherein the ADC is configured to:
convert the first voltage and second voltage into a digital value;
store the digital value in the memory; and
cause the control signal to alternate between indicating the first state and indicating the second state at a frequency determined by the ADC; and
processor circuitry having an input coupled to the memory and configured to perform an action based on the digital value.

11. The device of claim 10, wherein:
the conversion of the first voltage and the second voltage into the digital value is a first conversion;
the ADC is further configured to perform multiple conversions of the first voltage and the second voltage into multiple digital values; and
a rate at which the control signal alternates between indicating the first state and indicating the second state is based on a rate of conversion of the output of the operational amplifier.

12. The device of claim 10, wherein the switch circuitry, the operational amplifier, the ADC, the memory, and the processor circuitry are implemented together in a microprocessor.

13. The device of claim 10, wherein to convert the first voltage and second voltage into the digital value, the ADC is further configured to:
sample the output of the operational amplifier for a first period in which the operational amplifier generates the first voltage;
sample the output of the operational amplifier for a second period in which the operational amplifier generates the second voltage; and
compute the digital value based off an average of the sample from the first period and the sample from the second period.

14. The device of claim 10 further comprising:
a first resistor coupled between the output of the operational amplifier and the second switch input of the switch circuitry; and
a second resistor coupled between the first resistor and a ground.

15. A method comprising:
in a first state:
using a switch, electrically coupling an input voltage to a positive input of an operational amplifier;
using the switch, electrically coupling an output of the operational amplifier
to a negative input of the operational amplifier;
generating, using the operational amplifier, a first voltage based on the input voltage;
sampling, using an Analog to Digital Converter (ADC), the first voltage;
generating, based on the sampling of the first voltage, a control signal configured to specify a second state; and
in the second state:
using the switch, electrically coupling the input voltage to the negative input of the operational amplifier;
using the switch electrically coupling the output of the operational amplifier to the positive input of the operational amplifier;
generating, using the operational amplifier, a second voltage based on the input voltage;
sampling, using the ADC, the second voltage; and
converting, using the ADC, the first voltage and the second voltage into a digital value.

16. The method of claim 15, wherein:
the converting of the first voltage and the second voltage into the digital value is a first conversion;
the method further comprises performing, using the ADC, multiple conversions of the first voltage and the second voltage into multiple digital values; and
a rate at which the first state and the second state alternate is based on a rate of conversion of the output of the operational amplifier.

17. The method of claim 15, further including implementing the switch, the operational amplifier, and the ADC together on an integrated circuit.

18. The method of claim 15, wherein converting the first voltage and the second voltage into the digital value includes:
computing the digital value based off an average of the first voltage and the second voltage.

19. The method of claim 15, wherein:
the switch is a first switch; and
the method further includes:
connecting, using a second switch within the operational amplifier, second switch circuitry inputs to second switch circuitry outputs in a first configuration in the first state based on the control signal; and
connecting, using the second switch, the second switch circuitry inputs to the second switch circuitry outputs in a second configuration in the second state based on the control signal.

20. The method of claim 15 further comprising, in the second state, generating, based on the sampling of the second voltage, the control signal configured to specify the first state.

* * * * *